United States Patent [19]
Tercic et al.

[11] 4,150,404
[45] Apr. 17, 1979

[54] DEVICE FOR TRANSFERRING DIGITAL INFORMATION

[75] Inventors: Eduard J. Tercic, Hüttental-Weidenau, Fed. Rep. of Germany; Nicolaas A. M. Verhoeckx, Eindhoven, Netherlands

[73] Assignee: U.S. Philips Corporation, New York, N.Y.

[21] Appl. No.: 899,287

[22] Filed: Apr. 24, 1978

Related U.S. Application Data

[63] Continuation of Ser. No. 701,221, Jun. 30, 1976, abandoned.

[30] Foreign Application Priority Data

Jul. 8, 1975 [NL] Netherlands .................... 7508096

[51] Int. Cl.$^2$ .............................................. G11B 5/09
[52] U.S. Cl. ........................................ 360/39; 178/22; 340/347 DD

[58] Field of Search ................. 340/347 DD; 360/39, 360/40, 41, 42; 178/66, 67, 68, 22

[56] References Cited

U.S. PATENT DOCUMENTS 3,815,122  6/1974  Schwartz ............................... 360/40

Primary Examiner—Vincent P. Canney
Attorney, Agent, or Firm—Thomas A. Briody; James J. Cannon, Jr.

[57] ABSTRACT

A data recording device having a coding device which is supplied with a sequence of information bits to be recorded. The coding device forms coded information words of at least two different lengths from the sequence of information bits. The recording device further includes a divide-by-two member connected to the output of the coding device, a scrambler connected to the output of the divide-by-two member for scrambling the output signals of the divide-by-two member; and a write head connected to the output of the scrambler for recording the scrambled output signals.

15 Claims, 11 Drawing Figures

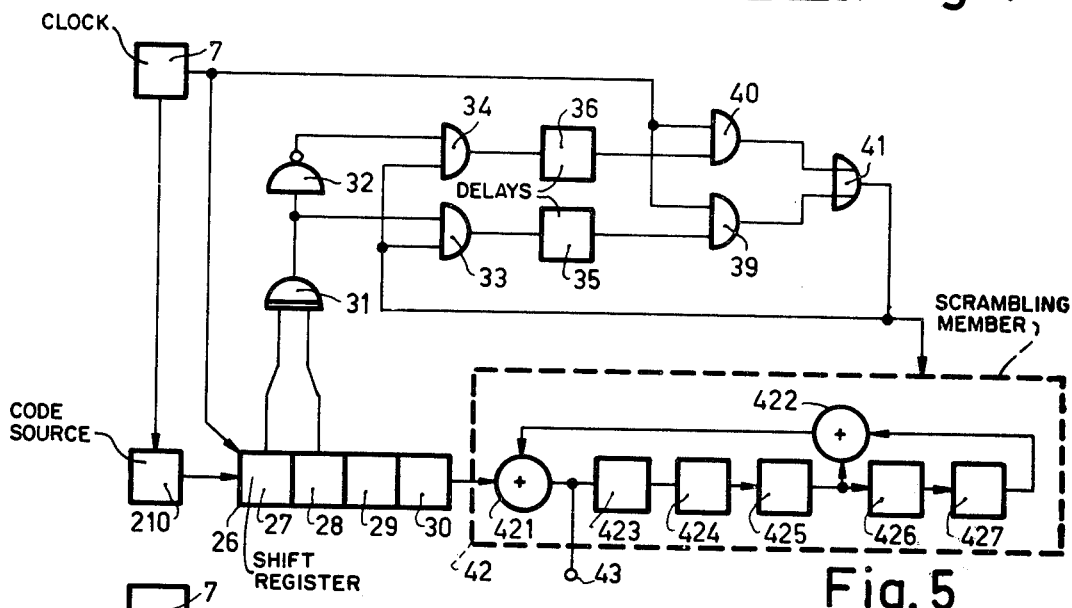
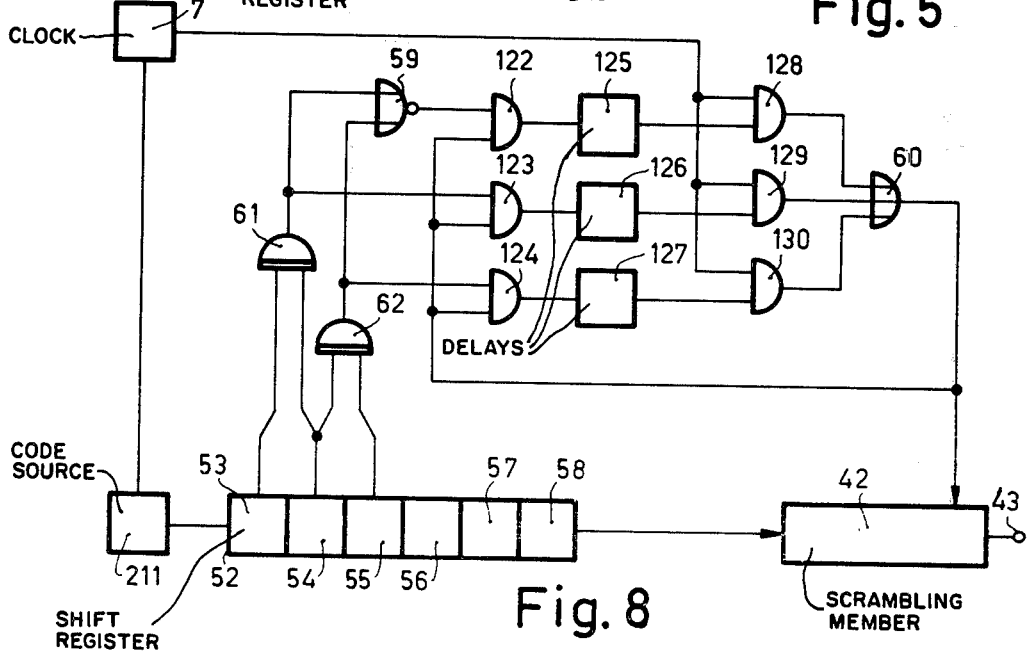

Fig. 9

| 30 | 423 | 424 | 425 | 426 | 427 |
|---|---|---|---|---|---|
|  | 1 | 0 | 1 | 0 | 1 |
| 0 | 0 | 1 | 0 | 1 | 0 |
| 1 | 1 | 0 | 1 | 0 | 1 |
| 0 | 0 | 1 | 0 | 1 | 0 |
| 0 | 0 | 0 | 1 | 0 | 1 |
| 1 | 1 | 0 | 0 | 1 | 0 |
| 0 | 1 | 1 | 0 | 0 | 1 |
| 0 | 1 | 1 | 1 | 0 | 0 |
| 0 | 1 | 1 | 1 | 1 | 0 |
| 0 | 0 | 1 | 1 | 1 | 1 |
| 0 | 0 | 0 | 1 | 1 | 1 |
| 0 | 1 | 0 | 0 | 1 | 1 |
| 0 | 1 | 1 | 0 | 0 | 1 |
| 0 | 1 | 1 | 1 | 0 | 0 |
| 0 | 1 | 1 | 1 | 1 | 0 |

Fig. 11

DEVICE FOR TRANSFERRING DIGITAL INFORMATION

This is a continuation of application Ser. No. 701,221, filed June 30, 1976, now abandoned.

The invention relates to a device for transferring via a medium or for storing in a medium, through a bivalent state of this medium, binary information bits which can be received in a non-restricted succession of bit cells on an input of a provided coding device, each time groups of alternatively at least two different number of information bits (information words) being formed on the basis of the said information bits received, the coding device forming on the basis thereof groups of numbers of code elements (code words), which groups correspond each time to, but are larger than, an information word, in a succession of channel symbols, a code element corresponding to the presence or absence of a transition between the two values of the said bivalent state. The medium can be a magnetizable tape which can be driven along a read and/or write head. It may alternatively concern a data transmission channel. The information bits can have the value "0" or "1" without restriction, so that no further restrictions are imposed as regards the coding by the information source. The information bits need only have the correct length and must occur synchronously. The information bits each time appear in bit cells, i.e. time intervals of a fixed length in which an information bit occurs or not. In the latter case the bit cell is empty. Furthermore, no restrictions are imposed as regards the appearance of the information bits, so that the latter may consist of a signal level, the presence or absence of a transition, a waveform having a given direction etc., in accordance with known techniques.

The code elements occur in a succession of channel symbols. A channel symbol is to be understood to mean herein a time interval of fixed length in which a state transition does or does not occur. It is desirable to incorporate clock pulse information also in the medium: a separate track or channel is not required in that case. The required bandwidth is preferably small. The known bi-phase and double-frequency codes contain at the most two and at least one transition between the two values of the state per bit cell. For such codes a comparatively large amount of clock pulse information is required, so that the capacity of the medium is limited. Codes are known which comprise less transitions, for example, at the most one transition per bit cell. For example, U.S. Pat. No. 3,108,261 discloses the so-termed delay code. Two successive bit cells then contain at the most two and at the least one transition of the said state. In accordance with this code, a bit cell containing the information "0" followed by a bit cell containing the information "1" does not produce a transition. Two successive information bits "0" are separated by a transition. The information "1" produces a transition at the middle of the relevant bit cell. Successive transition are thus spaced at least one and at the most two bit cells apart.

The above coding can be considered as the formation of groups of code elements (code words or coded information words) from corresponding groups of information bits (information words). The information bits may have any arbitrary physical appearance. As regards the state of the medium it is assumed hereinafter that a code element "1" contains a signal change or transition (for example, at the beginning of the said code element); in that case a code element "0" does not contain a transition. The reverse convention offers corresponding results. As long as the code elements have not yet been introduced into the medium, and also after they have been read from the medium, they can have different physical appearances again. In accordance with the known technique, the coding can be realized by way of the following code alphabet, consisting of code words, in which the groups of information bits or information words are converted:

| information words | code words |
|---|---|
| 1 | 01 |
| 01 | 0001 |
| 00 | 0010 |

Each time one or more code elements 0 are thus inserted between successive channel symbols and code elements "1". As a result, the symbol interference in the channel is reduced. Furthermore, there are only three code words, so that the implementation is very simple. On the other hand, the efficiency is limited. The efficiency is defined as the mean number of information bits per channel symbol; in this case the mean number amounts to only 50%. Furthermore, the state transitions may occur comparatively closely together, i.e. in the case of an input information 1111 where always one transition per information bit occurs.

The invention, however, has for its object to realize a system offering high efficiency coupled to a high transmission speed, so that the channel capacity is better utilized, the state transitions being adequately separated from each other. The invention has for its object to provide a system having a short code alphabet. The invention also has for its object to maintain the self-synchronizing properties of the code elements to be transferred via the medium or to be stored in the medium. The invention furthermore has for its object to realize a comparatively simple device. The invention also has for its object to provide a coding device in which no upper limit is imposed as regards the interval between two successive code elements which would cause a transition of the said state if no further steps were taken. The invention also has for its object to provide a system having a fixed length ratio between information words and code words for a uniform information transport speed. The objects in accordance with the invention are realized in that the coding device is adapted to separate successive code elements of a first value, which would cause a transition in the said state, by at least one code element of the other value, without an upper limit being imposed as regards the successive uninterrupted appearance of a series of code elements of the said other value, the output of the coding device furthermore being connected to an input of a keying device which is adapted to serially increase, in order to avoid series of successive code elements without transitions, the number of code elements comprising a transition, without directly successive code elements both exhibiting a transition in the said state.

The basic structural components of the device thus consist of a coding device which forms the code words and a keying device which substantially reduces the risk of long series of transition-less code elements in the medium. The information conversion is thus effected in two steps as if it were, it being possible to adapt the steps to each other, so that an optimally operating but uncomplicated device is obtained. The object according to the invention can be realized on the one hand by changing code elements, and on the other hand by the addition of code elements.

The keying device preferably comprises a scrambler which is adapted to receive code elements serially and to change the value of code elements in order to avoid series of successive transition-less code elements, without directly successive code elements both implying a transition, an input shift register of the said scrambler being controlled by a series of clock pulses from a clock with which code elements received thereby are isochronous, an output of the shift register being connected to an input of a scrambling member, the information of the input shift register activating a blocking circuit so as to pass only part of the said clock pulses to the scrambling member, an output of the scrambling member being connectable to the medium. Thus, only code elements are changed, so that the efficiency is maintained.

The coding device preferably supplies pulse-shaped signals, a divide-by-two member being connected between the coding device and an input of the scrambler, the scrambling member supplying static signals and being connected to the medium via a change-of-state coder. Due to the addition of these further components and the adaptation thereof to each other, a very attractive system is realized in which code elements having a change of state are always separated by one or more code elements without change of state, while the risk of sequences of many code elements without change of state is very small. For the same frequency characteristic, the signalling speed in the channel (or the writing density in a magnetizable medium) can be increased as a result of the said separation. Within the context of the physical properties of the medium, this offers the possibility of better utilization of the medium capacity.

Referring to the present state of the art, U.S. Patent No. 3,647,964 discloses a coding device having a code alphabet in which an unlimited series of code elements "0" is permissible, successive elements "1" always being separated by at least one code element "0". The latter, however, is not applicable between successive code words, so that the objects of the present invention, that is to say the realization of a combination of a simple, short code alphabet, a high efficiency and the prevention of directly successive code elements containing a transition, while the risk of long sequences of transition-less code elements is low, are not realized thereby. Moreover, in accordance with the said U.S. Patent Specification all code words have the same length, so that a large code alphabet (many words) is required. Obviously, this results in a complex coding device.

U.S. Pat. No. 3,685,033 discloses a code conversion permitting shorter code alphabets; however, two code elements "1" can again directly succeed each other, so that the information density cannot be increased. Moreover, an upper limit is imposed as regards the number of successive code elements "0"; as a result, the code words are comparatively long.

Scramblers are known per se from U.S. Pat. No. 3,421,146 priority date Feb. 8, 1964, and a more recent article by D. J. Leeper, A universal digital data scrambler, Bell System Technical Journal, Vol. 52, No. 10, December 1973, pages 1851-1865. However, the present invention consists in the advantageous combination of the following attractive properties:

(a) there are at least two different lengths of the code words;

(b) an unlimited number of successive code elements "0" is permitted on the output of the coding device;

(c) in a first embodiment, two successive code elements (1) are separated by at least one code element "0"; in a second embodiment, they are separated by at least two code elements "0";

(d) a scrambler is used to realize resynchronization; "Isochronism" is to be understood to mean the property of a recurrent phenomena that the interval between two significant instants is in theory equal to a unity interval, defined as such, or to an integer multiple of the said unity interval.

An output element of the medium is preferably connectable, via a divide-by-two member, to an input of an unscrambler pairwise associated with the said scrambler, an output of the said unscrambler being connected to an input of a decoding device pairwise associated with the said coding device, for recovering the information bits, received on the input of the coding device, on an output of the said decoding device, the unscrambler supplying static signals and being connected, via a change-of-state coder, to an input of the decoding device. The original information can thus be recovered by means of a device which is substantially symmetrical to the input device.

The lengths of the groups of information bits, expressed in numbers of bits, and the groups of code elements, each time corresponding thereto, preferably relate only as 2:3, the clock frequency corresponding to the repetition frequency of the code elements received in the input shift register, a blocking unit being activatable, under the control of the information contents of two successive stages of the input shift register, for blocking each time at least one clock pulse for the said scrambling member before deactivation of the blocking unit. Thus, a simple code alphabet can be realized, while the scrambler is also simple and the efficiency is higher than according to the state of the art.

In the case of a difference in state, preferably each time two clock pulses are blockable under the control of the information contents of the said two successive shift register stages, while for the remainder each time one clock pulse is blockable before deactivation of the blocking unit. The scrambling member can thus have simple control.

The coding device is preferably adapted to separate successive code elements of a first value, which would cause a transition, by at least two code elements of the other value without an upper limit being imposed as regards the uninterrupted succession of a series of code elements of the said other value, the lengths of the groups of information bits, expressed in numbers of bits, and the groups of code elements, each time corresponding thereto, relating only as 1:2, the said clock frequency corresponding to the repetition frequency of the code elements received in the said input shift register, a blocking unit being activatable, under the control of the information contents of three successive stages of the input shift register, for blocking each time at least two successive clock pulses for the said scrambling member before deactivation of the blocking unit. The code alphabet is thus further simplified, while the efficiency of the medium is further increased. In the case of a deviating state of the first shift register stage with respect to the two other stages of the three successive shift register stage, four clock pulses are preferably blockable under the control of the information contents of the said three successive shift registers, while in the case of a deviating rent state of the third shift register stage, three block pulses are blockable, and otherwise each time two clock pulses are blockable before deactivation of the blocking unit. The control of the scrambling member is thus only slightly more complex than previously described.

Furthermore, the keying device preferably comprises an output device which is adapted to receive code elements and which, in order to avoid series of successive transition-less code elements, serially adds, each time in direct succession, a code element having a transition and a code element without transition to a predetermined number of code elements, without directly successive code elements both implying a transition. Excessively long series of transitionless code elements are thus definitely precluded. The efficiency is then slightly reduced, but it will be found that it can still be chosen to be adequate.

The invention will be described in detail hereinafter with reference to some drawings.

FIG. 4 shows a clock pulse diagram relating to FIG. 3.

FIG. 5 shows a diagram of a scrambler relating to FIG. 3.

FIG. 8 shows a second scrambler.

FIG. 9 shows a time diagram relating to FIG. 8.

FIG. 11 shows an information diagram relating to the scrambling member of FIG. 5.

First of all, a code will be described in which successive transitions of the said state of the medium can occur at intervals T, 3/2T, 4/2T, 5/2T, ... from each other, the unit T/2 being the length of a code element. It can be proved that in the case of an infinite maximum length of the code words (and hence a correspondingly complex coding device), an efficiency improvement of 38% can be achieved with respect to the commonly used NRZ-1 code. Hereinafter a very short code alphabet is given, by way of example, with an inherently simple coding device whereby an efficiency which is already approximately 33% higher is achieved: the efficiency of the representation is ⅔ (two information elements are represented on three code elements), but in the most favorable case, depending on the channel properties, the signalling speed can be doubled, because two code elements comprising a transition can never be directly successive.

| Information words: | Code words: |
| --- | --- |
| 11 | 000 |
| 10 | 010 |
| 01 | 100 |
| 0011 | 001000 |
| 0010 | 001010 |
| 0001 | 101000 |
| 0000 | 101010 |
| DCBA | PONMLK |

The information bits are received in a sequence progressing from left to right in this example. If one of the first two bits concerns a logic "1", the first three lines are applicable. If no "1" is present, two information bits must be received as yet before a complete code word can be composed. Each code word of three or six code elements terminates with a code element "0" (no transition), so that always one or more code elements "0" occur between successive code elements "1". Because the code word 000 also occurs, no upper limit exists as regards the number of code elements "0" occurring in uninterrupted succession. Obviously, this is only one of the code alphabets feasible within the scope of the invention. For example, code words of equal length can be interchanged, and all code words can also commence with a code element "0" instead of terminating therewith. Moreover, one of the two columns can be read from right to left. However, all possibilities are covered by the group of seven information words.

A description will be given hereinafter of two realizations of the invention, i.e. one comprising a scrambler where the information of code elements is changed, and one comprising a device in which additional code elements containing a transition are added.

Figure 1:
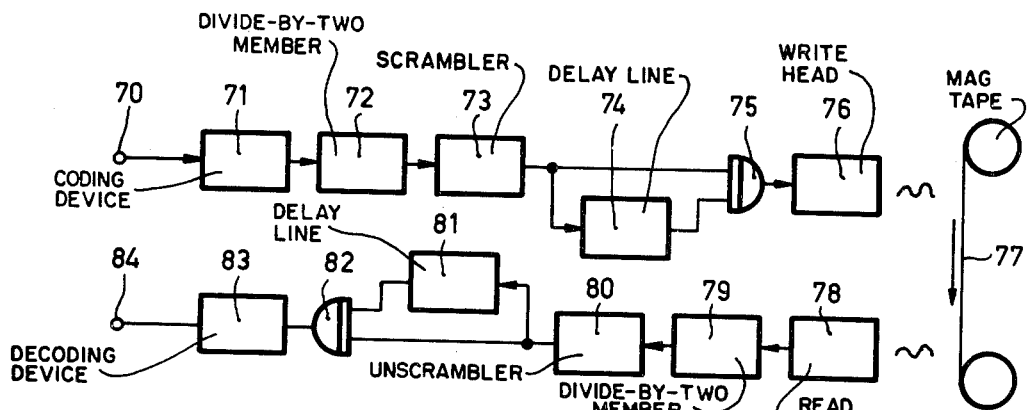
FIG. 1 shows a block diagram of a first embodiment in accordance with the invention.

FIG. 1 shows a block diagram of a first embodiment in accordance with the invention which is intended for use in a data storage system utilizing a magnetic tape. The information bits are input on input terminal 70, for example, from a central data processor. The information bits are applied to the coding device 71 which forms information words therefrom and which converts these information words into code words in accordance with the above coding diagram. For the time being, a code element "1" can be represented by a pulse, and a code element "0" by the absence of a pulse. The subsequent transmission through the channel is not yet influenced thereby. These code elements are serially applied to the divide-by-two member 72. The output signals of this divide-by-two member (for example, a flipflop) are applied to the scrambler 73. As will be described hereinafter, this scrambler each time combines two, or possibly three, channel symbol time intervals without change in the state of the divide-by-two member, and generates a clock pulse for a scrambling member which forms part of the scrambler and which scrambles the code information. The output signals of the scrambling member are applied to a change-of-state coder which comprises a delay line 74 having a delay time which corresponds to the length of a channel symbol (½T). The output signals of the element 73 and the delay line are applied to the exclusive-OR-gate (modulo-2 adder) 75, with the result that the members 74 and 75 together supply a signal only if a change of state occurs in the input signal thereof. The output signal of the gate 75 is applied to and stored in the magnetic tape 77 via a write amplifier 76. The code elements stored in the magnetic tape can be read by a read head/amplifier 78 which generally has a differentiating operation, so that pulse-shaped output signals appear which are applied to the divide-by-two member 79. The output signals of the divide-by-two member are applied to the unscrambler 80 associated with the scrambler 73, so that the modifications introduced by scrambling can be restored. The output signals of the unscrambler are applied to the member 81, 82 whose construction and function can correspond to that of the members 74 and 75 and which thus form a change-of-state coder. The output signals of the gate 82 are applied to the decoding device 83 which is constructed to be associated with the coding device 71, so that the original information bits can be recovered on the output terminal 84, for example, for use in the central data processor or in an other user device. The magnetic tape device 77 can be replaced in a corresponding manner by a line connection between transmission and receive amplifiers 76, 78. In given cases the receive member 78 will not have a differentiating operation; in that case the divide-by-two member 79 can be dispensed with.

Figure 2:
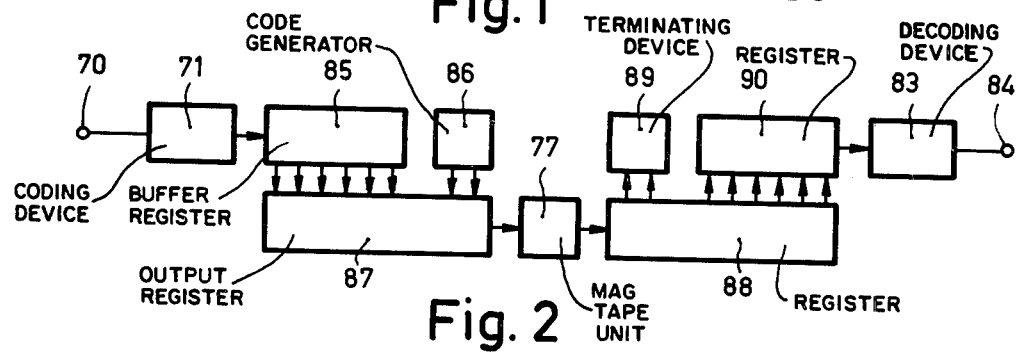
FIG. 2 shows a block diagram of a second embodiment in accordance with the invention.

FIG. 2 shows a block diagram of a second embodiment in accordance with the invention. In this case additional code elements are added. The information bits reach the coding device 71 via the terminal 70. The output signals of the coding device are applied to the buffer register 85. When the buffer register reaches a given degree of filling, for example, 12 code elements, detection takes place and these 12 code elements are transferred in parallel to the output register 87 which then also receives a 12 code element 1 and a code element 0 from the code generator 86, so that the ultimate result can never contain two code elements 1 in direct succession. In the previous example of a code alphabet, the said code element 1 from the generator 86 would then directly adjoin the said code element K. The output signals of the output register 87 are applied to the medium 77 (the devices 76, 78 shown in FIG. 1 have been omitted for the sake of simplicity). The signals read are applied to the register 88. When 14 code elements have been serially received therein, detection takes place and the code elements are applied in parallel to the register 90 and to the terminating device 89 which operates for example, as a register, the added (by element 86) non-significant code elements being applied to this terminating device and being excluded from further use. The signals of the register 90 are applied to the output terminal 84 via the decoding device 83. Due to the addition of the two additional code elements, the efficiency is decreased by a factor 12/14, but the increase of the transport speed of the channel symbols by a factor 2 represents an improvement. Moreover, no more than 13 successive code elements 0 can ever occur in direct succession. This number will generally not be too high for proper synchronization. In other cases it will be advantageous to assign a different capacity to the registers 85 and 90, for example, 9 or 15 bits.

Figure 3:
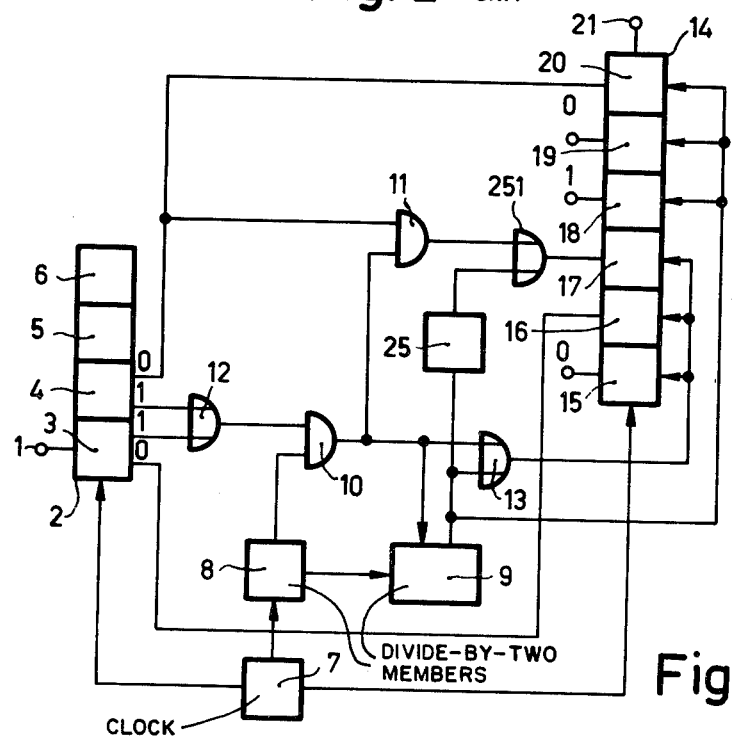
FIG. 3 shows a diagram of a coding device.

FIG. 3 shows a diagram of a coding device, comprising an information input terminal 1, a shift register 2 having stages 3, 4, 5, 6, a clock 7, two divide-by-two members 8, 9, two logic AND-gates 10, 11, three logic OR-gates 12, 13, 251, a shift register 14 comprising stages 15, 16, 17, 18, 19, 20, and an information output terminal 21. FIG. 4 shows the clock pulse series used in the circuit shown in FIG. 3 on three lines 22, 23, 24.

The information bits can be received on the terminal 1 in the described organization. The shift register 2 is controlled by the clock pulses shown in FIG. 4, line 22. The divide-by-two member 8 receives the clock pulses in accordance with line 23, FIG. 4.

After the first clock pulse on the line 22, the stage 3 contains the first information bit. After the first clock pulse on the line 23, the bistable divide-by-two member 8 assumes the "1"-position. After the second clock pulse on the line 22, the stages 3, 4 contain the first two information bits. If at least one of these two bits is a logic "1", the corresponding "1"-output is activated and the OR-gate 12 supplies a logic "1"-signal to indicate that the first code word to be formed comprises only three channel symbols. In that case the stage 3 contains the information bit A, while the stage 4 contains the information bit B of the already described coding example. The next clock pulse on the line 23 resets the divide-by-two member 8 to the zero position, and applies a carry output signal to the divide-by-two member 9, which assumes the one-position, and also (slightly later) to the logic AND-gate 10, with the result that the gates 11 and 13 receive a logic "1". The output signal of the gate 10 also resets the divide-by-two member 9 to the zero position. Via the OR-gate 13, the shift register stages 15, 16, 17 are activated to take over input information, the following functions then being implemented:

K(stage 15):=0 (due to an input terminal being at fixed potential)
L(stage 16):=$\overline{A}$ (stage 3)
M(stage 17):=$\overline{B}$ (stage 4).

The symbol := indicates the effectuation of an information modification in known manner. If none of the stages 3,4 contains an information bit "1" after the second shift pulse, nothing happens, however, because in that case the information word to be formed has a length of four bits. The divide-by-two member 9 then also remains in the "1"-position. After the subsequent third clock pulse on the line 23, the divide-by-two member 8 assumes the 37 1"-position again. After the fourth clock pulse on the line 22, the stages 3, 4, 5, 6 contain the information bits A, B, C, D, respectively. After the fourth clock pulse on the line 23, the divide-by-two member 9 resumes the zero position and supplies a carry output signal, with the result that the shift register stages 18, 19, 20 are directly activated and the shift register stages 15, 16, 17 are activated via the OR-gate 13 to take over input information. Via the delay member 25, this pulse is also applied to the reset input of the stage 17, with the result that the latter assumes the zero position again, also if one of the stages 3, 4 were to contain an information bit "1". For simplicity the logic symbol of an OR-gate was chosen, though, in effect, in the case of a six-bit code word the lower input of gate 251 is overruling. In an other case the output signal of the member 25 would be applied directly to the relevant reset input. The following functions are thus implemented:

K(stage 15):=0
L(stage 16):=$\overline{A}$ (stage 3)
M(stage 17):=0
N(stage 18):=1
O(stage 19):=0
P(stage 20):=$\overline{B}$ (stage 4)

The inversion is achieved by way of a connection to the inverted output of the stages 3, 4. The constant signal input terminals for the stages 15, 18, 19 can be connected to invariable signal sources (not shown). The shift register 14 receives the clock pulses on the line 24 at a repetition frequency which is 50% higher than on the line 22. Thus, three stages of the shift register 14 are always emptied for taking over code elements which correspond to two information bits in the shift register 2. The delay by the member 25 can correspond to ½ clock pulse interval on the line 23. The stages 5, 6 can possibly be dispensed with. The described coding device serves merely as an example of the element 71 of FIG. 1, 2. It is alternatively possible to use exclusively a combinatory circuit. On the other hand, the coding can also be effected by means of a table which is permanently stored, for example, in a read-only memory.

Figure 6:
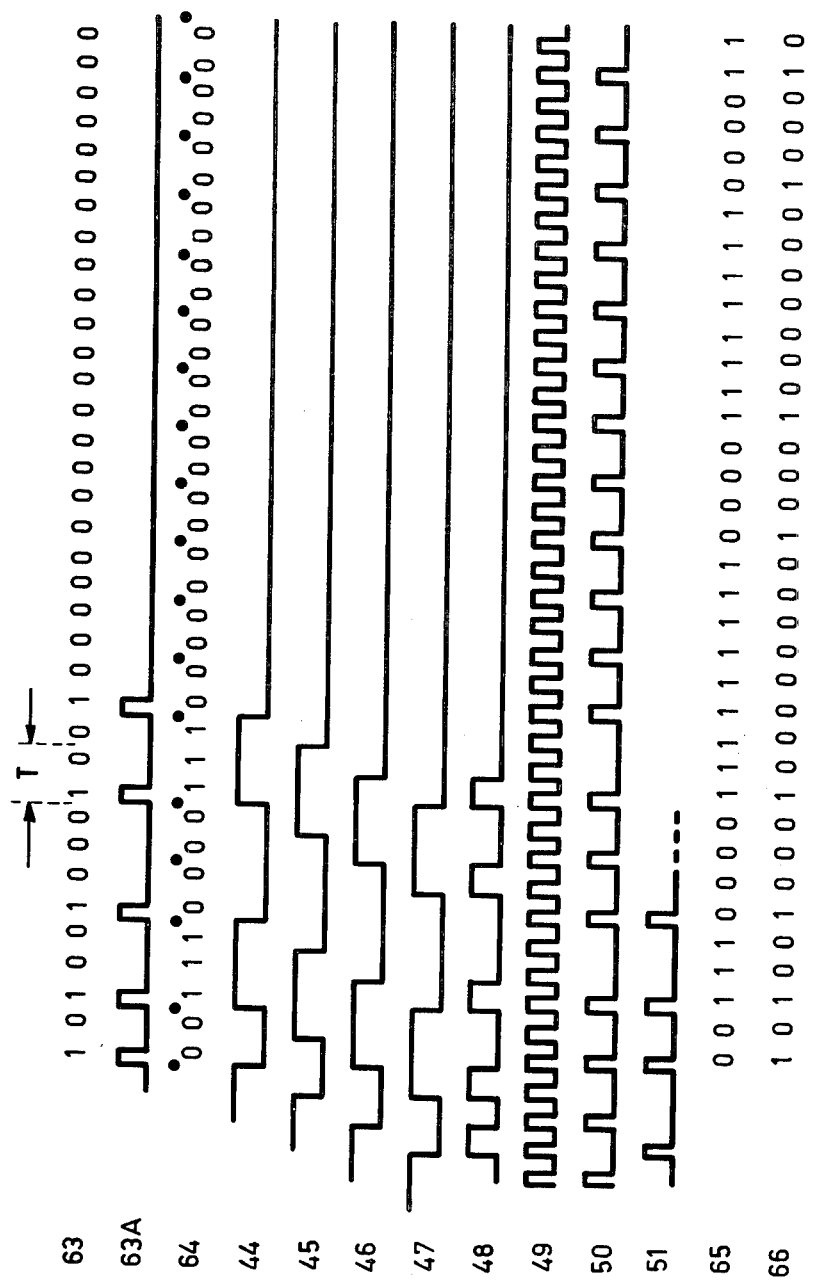
FIG. 6 shows a time diagram relating to FIG. 5.

FIG. 5 shows a block diagram of a scrambler to be used in a device as shown in FIG. 3, comprising a clock 7 (see FIG. 8), a source for code elements 210, a shift register 26 comprising stages 27, 28, 29, 30, an exclusive-OR-gate 31, an inverter 32, four logic AND-gates 33, 34, 39, 40, a logic OR-gate 41, two delay members 35, 36, a scrambling member 42, and an output terminal 43. FIG. 6 shows an associated time diagram. Therein, the line 63 shows the series of signal elements originating from the coding device 71, it being impossible, as has already been stated, for two elements having the value "1" to occur together within an elementary time unit T. In this case signal elements of the line 63 having the value "1" are represented by a pulse (line 63A), signal elements "0" being represented by the absence thereof. The line 64 shows the output level of the signals of the divide-by-two member 72, the convention (line 44), contrary to the line 63(A), implying that a "1" bit corresponds to a high signal and a "0" bit corresponds to a low signal. The clock 7 can correspond to the clock 7 of FIG. 3, and thus controls the source of code elements 210 by way of a series of clock pulses having a frequency in accordance with FIG. 4, line 24. Therefore, the member 210 is in this case a symbolic representation of the divide-by-two member 72. The shift register 26 receives these clock pulses, for example, in accordance with FIG. 6, line 49. Assume that one of the gates 39, 40 passes a clock pulse to the output of the OR-gate 41. If the stages 27 and 28 contain the same information, the exclusive-OR-gate 31 then supplies a logic "0"-signal, while the inverter 32 supplies a logic "1"-signal, so that the AND-gate 34 is opened and the delay member 36 is started. Signals applied to the input of this member appear on the output true to shape, but after a delay which corresponds to the length of two clock pulse intervals on the line 49, so that the next clock pulse is blocked, only the subsequent second clock pulse being passed by the gate 40. However, if the stages 27 and 28 contain different information, the exclusive-OR-gate 31 supplies a logic "1"-signal, so that the AND-gate 33 is open and the delay member 35 is started. Signals received on the input of this member appear true to shape on its output, but after a delay which corresponds to the length of three clock pulse periods on the line 49, so that the next two clock pulses are blocked, only the subsequent third clock pulse being passed by the gate 39. The output pulses of the gates 39 and 40 actuate the scrambling member 42 via the OR-gate 41. This scrambling member substantially corresponds to that described in the cited article by Leeper. It comprises two modulo-2 gates 421, 422 and, in this simple case, five shifting members 423 ... 427, the information of which can each time be shifted one position further, under the control of the gate 41. The modulo-2 gates provide feedback. When the input information is passed on by the modulo-2 gate 421, it appears on the output 43.

FIG. 6 shows a time diagram relating to the foregoing. The line 47 shows the code elements stored in the stage 27; the lines 46, 45, 44 show the same for the stages 28, 29, 30, respectively. The line 49 shows the clock pulse, the phenomena on the lines 44-48 being isochronous therewith: a signal change on these lines is always coincident with a positive-going clock pulse edge. The line 48 shows the output signal of the gate 31. On the line 50 is is assumed that the first clock pulse is passed; this is, of course, determined by the case history. The line 48 is then low, because the lines 46 and 47 then both indicate a high signal. As a result, the gate 34 is opened and only one clock pulse is blocked. For the line 51 it is similarly assumed that the first clock pulse is blocked. Upon the appearance of the next clock pulse, the members 27 and 28 contain different information, so that two clock pulses are blocked by way of the member 35. As from this instant the lines 50 and 51 are identical. It follows that the further passing or blocking of clock pulses is exclusively determined by the information then received, i.e. no longer by the said case history.

FIG. 11 shows an information diagram relating to the scrambling member 42 of FIG. 5. The columns 30, 423, 424, 425, 426, 427 show the output information of the corresponding numbered members of the circuit shown in FIG. 5. The third line contains an arbitrary starting position. The input information is that of the line 64 of FIG. 6 (also line 44), at the area of a dot each time a break being given by a clock pulse on the line 50 of FIG. 6; thus, each time two or three bits of the same information contents on the line 64 are combined. The exclusive-OR-gates 421, 422 directly determine the output information which corresponds to that shown in the column 423. Therefore, in the second line of FIG. 11 this information is: $(1+1+0) \mod 2 = 0$. In the third line: $(0+0+1) \mod 2 = 1$, the information formed each time being shifted over one column position. This output information is shown on the line 65 in FIG. 6. The members 74 and 75 (change-of-state coder) of FIG. 1 form a code element 1 on the line 66 in reaction to each signal change on the line 65, the write amplifier 76 being controlled by the said code element in order to reverse the magnetization direction in the tape 77. If the signal to be transmitted concerns a signal level, the members 74, 75 can be dispensed with. For example, two successive code elements 1 do not occur on the line 66, while the probability of a long series of successive code elements 0 is substantially reduced: see the last portion of the line 68 which still gives rise to transitions in the line 63A. The risk of a long series of transitionless code elements can be arbitrarily reduced by including a sufficiently long series on the fed back elements 423-427 in the scrambling member. The member 79 is analogous to the member 72, so that from the signal read (line 66) the signal of the line 65 is formed again. The specific properties of the members 76, 77, 78 do not restrict the invention and will not be elaborated herein. The member 80 is an unscrambler which is associated with the member 73. This means that the unscrambler has a different construction (see the article by Leeper), but the members of FIG. 5 can be used with the same construction and configuration, the member 210 then corresponding to the divide-by-two member 79. For the unscrambler there is again provided a network of five shifting members, the outputs of the third and the fifth member being fed back for a modulo-2 gate whose output is coupled to a further modulo-2 which also receives the input signal and which supplies the output signal. On the other hand, the input signal is then directly applied to the first shifting member. Generally, the construction of the scrambling member and that of the unscrambling member must be adapted to each other. The passing and blocking of clock pulses is effected as shown in FIG. 5. The members 81/82 correspond to the member 74/75. The information of FIG. 6, line 63, is thus recovered.

Figure 7:
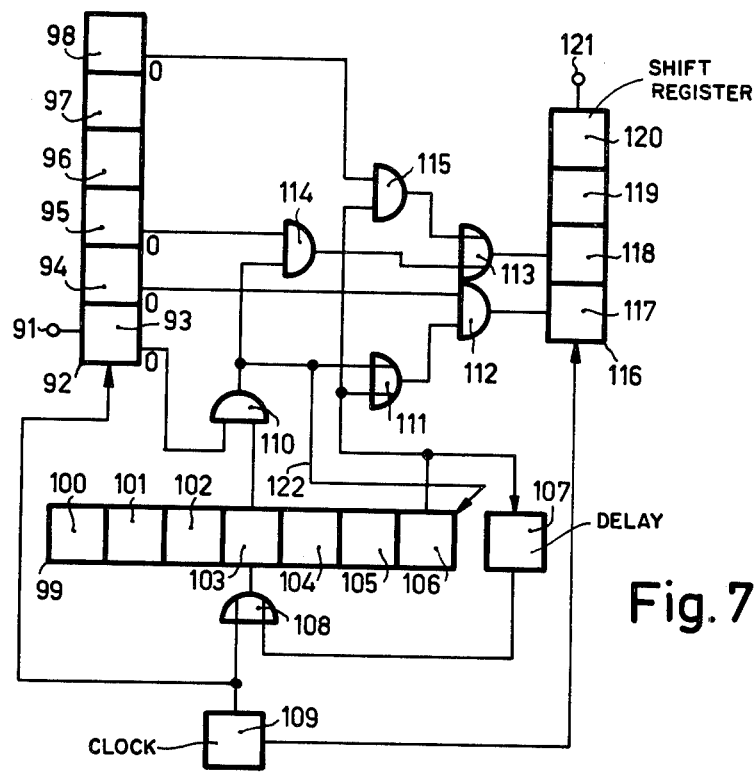
FIG. 7 shows a decoding device relating to FIG. 3.

FIG. 7 shows a decoding device relating to FIG. 3, comprising an input terminal 91, a shift register 92 comprising the stages 93-98, a ring counter 99 comprising the stages 100-106, a delay member 107, a clock 109, a logic OR-gates 108, 111, and 113, logic AND-gates 110, 112, 114, 115, a shift register 116 comprising the stages 117-120, and an output terminal 21.

The code elements (see also FIG. 6, line 1) arrive on the input terminal 91 in a sequence which corresponds to a direction from left to right in the said table. The advancing in the shift register 92 is effected under the control of the clock 109 by the same clock pulses which also advance the ring counter 99 via OR-gate 108. Always only one stage of this ring counter supplies a logic "1"-signal. In the starting position, this is the stage 100. Under the control of the first clock pulse, the first code element is stored in the stage 93 and the stage 101 is set to the "1"-position. Under the control of the second and the third clock pulse, the ring counter stage 103 is set to the "1"-position, the first three code elements then occupying the stages 95, 94, 93, respectively, When the stage 93 then contains a code element 0, the AND-gate 110 receives two logic "1"-signals to signify that one of the first three lines of the said table is concerned: element K=0. The following logic functions are then implemented.

A(stage 117):=$\overline{L}$ (stage 94)
B(stage 118):=$\overline{M}$ (stage 95)

Via the gate 111, the gate 112 is opened to fill the stage 117 with the inverted information (output 0) of the stage 94. The gate 114 is opened to fill the stage 118, via the gate 113, with the inverted information of the stage 95. Moreover, the output signal of the gate 110 returns the ring counter 99 to the zero position via the line 122, possibly after a small delay, so that the process can be restarted. However, if the said gate 110 does not receive two logic "1"-signals, one of the last four lines of the said table is concerned, and the relevant code word comprises six bits. Nothing happens for the time being, but the next three clock pulses ultimately cause the stage 106 to supply a logic "1", while the code elements successively occupy the stages 98 ... 93.

At that instant the following logic functions are performed:

A(stage 117):=$\overline{L}$(stage 94)
B(stage 118):=$\overline{P}$(stage 98)
C(stage 119):=0
D(stage 120):=0

The gate 112 is then opened in the described manner via the gate 111. Furthermore, the gate 115 is opened in order the fill the stage 118, via the gate 113, with the inverted information of the stage 98. The stages 119, 120 are not specially controlled and can possibly be omitted. It is assumed that the stages 117 ... 120 are controlled by a clock pulse from the clock 109 at a frequency which corresponds to $\frac{2}{3}$ times that applied to the shift register 92, without clock pulses interfering with each other, in a manner as described with reference to the FIGS. 3, 4. The stage 117 is then each time filled with the information 0, while the stages 117, 118 can subsequently be erased by the information 1, if necessary, from the gates 112, 113. The information bits can be recovered on the output 121; this output can correspond directly, for example, to the output 84 of FIG. 1. The output signal of the stage 106 is applied to the ring counter 99 after a small delay, via the member 107 and the gate 108, with the result that the counter is reset to the zero position.

Hereinafter a code will be described in which successive transitions of the state of the medium can occur at intervals T, 4/3T, 5/3T, 6/3T ... from each other, $\frac{1}{3}$T being the length of a code element. Hereinafter a particularly short code alphabet is given whereby a substantial efficiency improvement is already achieved.

| Information bits: (words) | Code elements: (words) |
|---|---|
| 0 | 00 |
| 10 | 0100 |
| 11 | 1000 |
| UT | YXWV |

Each group of two or four code elements terminates with two code elements "00" (no transitions), so that always two or more code elements "0" appear between successive code elements "1". Because the code word "00" also occurs, there is no upper limit as regards the number of code elements "0" appearing in uninterrupted succession. Again, this is only one of the alphabets feasible within the scope of the invention. The coding device may have a structure analogous, to FIG. 3, but even simpler, because at the most two information bits have to be translated together into a code word. Because now always two code elements 0 occur between successive code elements 1 (or more), the signalling speed can be increased, depending on the circumstance, by at the most a factor 3 (again only the code elements 1 indicate a state transition). As a result, the transport speed of the information bits is increased by at the most a factor $1\frac{1}{2}$ and the channel capacity is better utilized accordingly.

The coding device for forming the code words can be constructed in the same manner as shown in FIG. 3, obviously a simpler set-up being obtained. The logic functions to be implemented for coding are:

(a) first information bit received is zero:
V:=0
W:=0

(b) first information bit is not zero: wait until second information bit is available:
V:=0
V:=0
W:=0
X:=$\overline{T}$
Y:=T A corresponding, simple logic function can be implemented for decoding.

FIG. 8 shows a scrambler for this code whose construction is substantially analogous to that shown in FIG. 5. The circuit comprises a clock 7 and a source of code elements 211 which satisfy the said requirements, and furthermore comprise a shift register 52 comprising stages 53, 54, 55, 56, 57, 58, two exclusive-OR-gates 61, 62, a NOR-gate 59, six logic AND-gates 122, 123, 124, 128, 129, 130, a scrambling member 42 comprising an output 43 (see also FIG. 5), three delay members 125, 126, 127, and a logic OR-gate 60. The clock frequency equals the repetition frequency of the code elements. When a clock pulse has been passed to the scrambling member 42 and the shift register elements 53, 54, 55 all contain the same information, none of the Exclusive-OR-gates 61, 62 supplies a logic "1", so that the logic NOR-gate 59 opens the gate 122 by supplying a logic "1". The member 125 applies the clock pulse received to the AND-gate 128, true to shape and after a delay time of three clock pulse periods, with the result that the next two clock pulses are blocked before the third one is passed. If the information of the stage 55 deviates (a "zero" verses two "ones" or a "one" versus two "zeroes"), the logic Exclusive-OR-gate 62 supplies a logic "1" and the gate 124 is opened to pass one clock pulse. Like the member 125, the member 127 introduces a delay time which, however, amounts to four clock pulse periods, so that the next three clock pulses are blocked, after which the subsequent fourth clock pulse is passed by the AND-gate 130. If the information of the stage 53 deviates, the Exclusive-OR-gate 61 supplies a logic "1" and the gate 123 is opened to pass a clock pulse which is passed by the member 126 after a delay of five clock pulse periods, so that the next four clock pulses are blocked and only the subsequent fifth clock pulse is passed. It is not possible for more than one of the gates 59, 61, 62 to supply a logic "1"-signal simultaneously.

Figure 9:
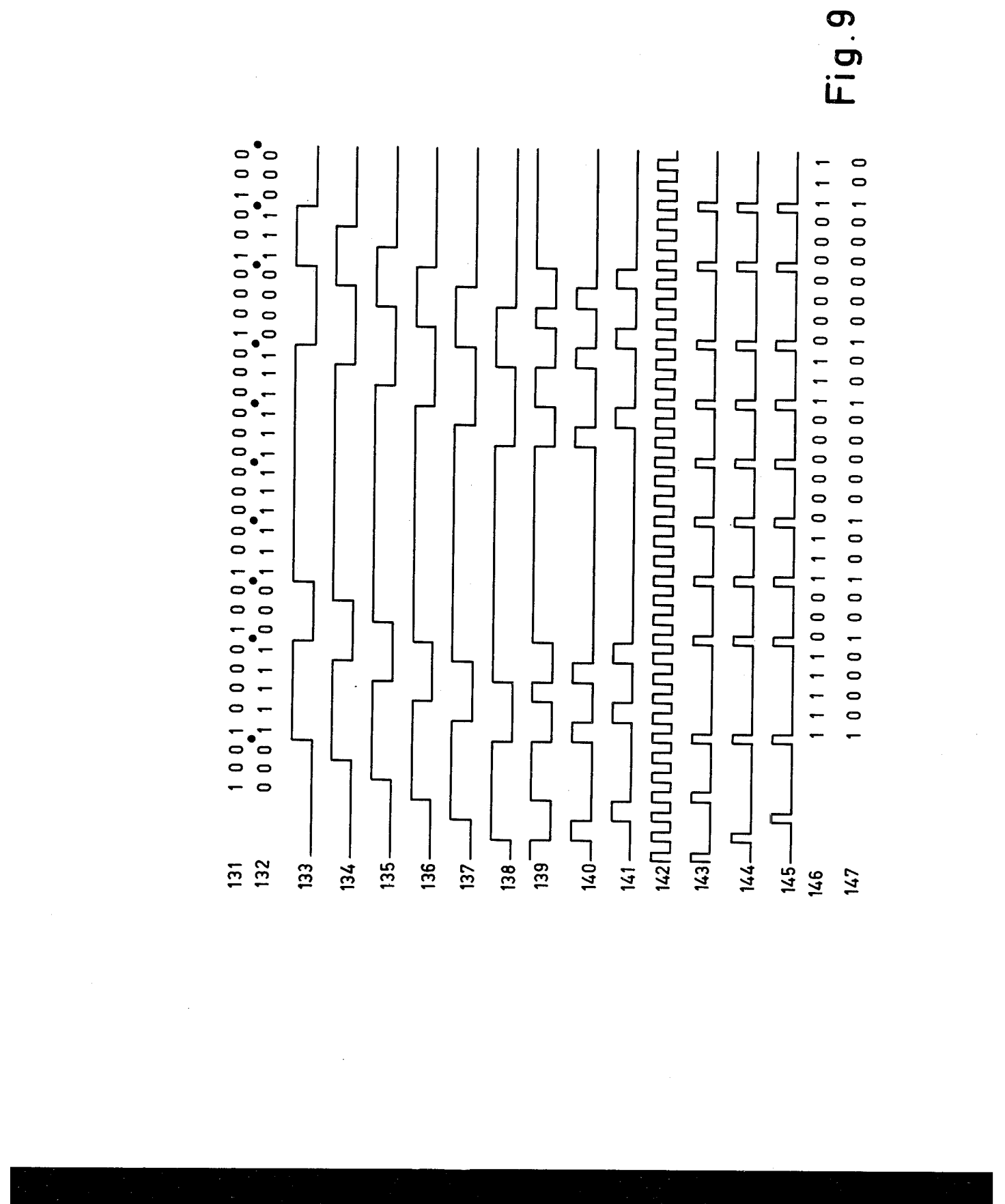

FIG. 9 shows a time diagram for the foregoing, like FIG. 6 shows a time diagram for the previously described coding example. The line 131 shows the output signals of the coding device, the "1" indicating a pulse-shaped code element. The line 132 shows the output signals of the divide-by-two member (compare member 72 of FIG. 1), transitions occurring between successive series of zeros and ones. The lines 133, 134 . . . 138 show the information contents of the members 58, 57, 56, 55, 54, 53, respectively. The line 139 shows the output signal of the gate 59. The line 140 shows the output signal of the gate 61. The line 141 shows the output signal of the gate 62. The line 142 shows the clock pulses of the clock with which the phenomena on the lines 133–141 are isochronous: elements 1 on the line 131 succeed each other at intervals of at least three clock pulse periods. The lines 143, 144, 145 show examples of feasible configurations of the output clock pulses. On the line 143 it is assumed that the first clock pulse is passed, depending on the case history. All stages 53–55 then contain the information 0, so that two clock pulses are suppressed. The same is applicable to the third clock, so that again two clock pulses are suppressed. On the line 144 it is assumed that only the second clock pulse is passed. The gate 61 then supplies a logic "1", so that four clock pulses are blocked. Subsequently, the situation is identical to that of the line 143. On the line 145 it is assumed that only the third clock pulse is passed. The gate 62 then supplies a logic "1", so that three clock pulses are blocked. Subsequently, the situation is identical to that of the lines 143, 144. Thus, it is sufficient to have a single output line which offers a clock pulse control which, after a brief starting phenomenon, for the remainder is independent of the case history. The line 146 shows the output signals of the scrambling member 42 of FIG. 5 which has been started with the same information contents as shown in FIG. 11. The line 147 shows the output signal of the change-of-state coder (for example, the members 74, 75 of FIG. 1). As regards the remaining parts of the circuit, FIGS. 3–6 show an example relating to the first code.

Figure 10:
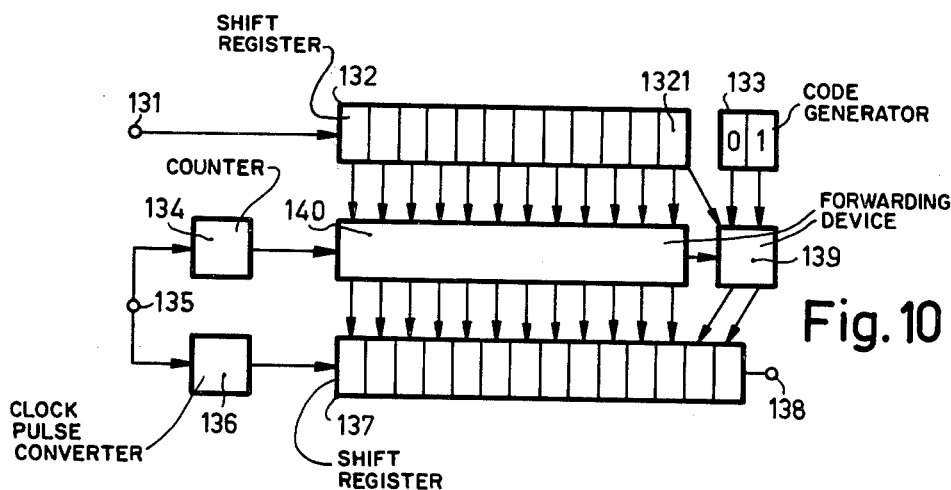
FIG. 10 shows an output device.

FIG. 10 shows, as part of the circuit shown in FIG. 2, an output device which can be used for both codes described, but which is notably described with reference to the circuit shown in FIG. 3. The terminal 131 of the said device can receive the code elements, i.e. from the terminal 21. The clock pulses corresponding thereto can be received on the terminal 135. These pulses are counted in the counter 134. When the latter reaches the position 12, the forwarding devices 140, 139 are activated and the information of the shift register 132 and the code generator 133 is stored in the shift register 137. If the final stage of the shift register 1321, contains a logic "1", the member 139 is controlled in a non-inverted manner, so that the last stages of the shift register 137 contain the information 101. However, if it contains a 0, the member 139 is controlled in an inverted manner, so that the final stages of the shift register 137 contain the information 010. This control is required, because the bit last received may concern a "1", in which the case the bit "N" of the said table is concerned, as well as a "0", in which case the bit "K" is concerned. Thus, it is not possible for two elements 1 to appear successively on the output terminal 138, while at the most 13 successive elements 0 can be generated. The additional bits can be added at the beginning or at the end of the series of twelve information bits. The clock pulse converter 136 receives the pulses from the clock (terminal 135) and multiplies the clock frequency by 14/12. Members of this kind are known per se.

What is claimed is:

1. A device for recording representations of a sequence of information words, each information word being composed of information bits having at least two values, comprising:

coding means having an input for receiving a sequence of information words, and an output for forming a corresponding sequence of coded information words of at least two different lengths, each coded information word having a length longer than the corresponding information word, each coded information word being composed of code elements having at least two values; said coding means functioning to separate each code element of a first value in an information word by at least one code element of a second value;

keying means having an input connected to the output of said coding means, and an output, said keying means functioning to modify said coded information words by increasing the number of code elements of a first value in each of said coded information words while retaining at least one code element of the second value between code elements of the first value in each of said coded information words; and write head means connected to the output of said keying means for recording the modified coded information words from said keying means.

2. A device as defined in claim 1, further comprising dividing means connected between said output of said coding means and said input of said keying means.

3. A device as defined in claim 2 wherein said dividing means is a divide-by-two member.

4. A device as defined in claim 1, further comprising recording media operatively associated with said write head means for storing said modified coded information words.

5. A device as defined in claim 4, wherein said recording media is magnetic tape.

6. A device as claimed in claim 4, further comprising:

read head means having an input for reading said sequences of modified coded information words from said recording media, and an output;

unscrambling means having an input connected to the output of said read head means, and an output; and decoding means having an input connected to said output of said unscrambling means.

7. A device as claimed in claim 6, further comprising a change-of-state coder connected between said output of said unscrambling means and said input of said decoding means.

8. A device as defined in claim 1, wherein said keying means comprises a clock for supplying a sequence of clock pulses with a predetermined frequency; an input shift register connected to and controlled by said clock having a plurality of successive stages, and including an input connected to said coding means for receiving said coded information words, and an output; a scrambling device connected to and controlled by said clock and including an input and an output; the output of said shift register being connected to the input of said scrambling device, the output of said scrambling device being connected to the output of said keying means; and a blocking circuit connected between said clock and said scrambling device for blocking a portion of said sequence of clock pulses supplied from said clock to said scrambling device.

9. A device as claimed in claim 1, wherein the ratio of the length of said information words expressed in number of bits, to the length of the corresponding coded information word, expressed in number of code elements, is 2:3.

10. A device as claimed in claim 1, wherein the ratio of the length of said information words, expressed in numbers of bits, to the length of the corresponding coded information word, expressed in number of code elements is 1:2.

11. A device as claimed in claim 8, wherein said clock frequency corresponds to the repetition frequency of the coded information words received in said input shift register, said blocking circuit being activatable under the control of the information content of two of said successive stages of said input shift register, for blocking at least one clock pulse to said scrambling device prior to deactivation of said blocking circuit.

12. A device as claimed in claim 10, wherein said blocking circuit is operative in the case of a difference in the information content of said two successive stages of said input shift register for blocking two successive clock pulses to said scrambling device prior to deactivation of said blocking circuit.

13. A device as claimed in claim 12, wherein said clock frequency corresponds to the repetition frequency of the coded information words received in said input shift register, said blocking circuit being activatable under the control of the information content of three of said successive stages of said input shift register for blocking at least two successive clock pulses to said scrambling device prior to deactivation of said blocking circuit.

14. A device as claimed in claim 13, wherein if the information content of the first stage of said input shift register differs from the information content of said second and third successive stages of said input shift register, four successive clock pulses to said scrambling device can be blocked; if the information content of said third stage of said input shift register differs from the information content of said first and second of said input shift register, three successive clock pulses to said scrambling device can be blocked, otherwise two clock pulses can be blocked prior to deactivation of said blocking circuit.

15. A device as claimed in claim 1 wherein said keying means functions to serially add in direct succession a code information word having a code element of the first value and a coded information word not including any code elements of the first value to a predetermined number of coded information words so that directly successive coded information words each include a code element of a first value.

* * * * *